(12) United States Patent
Kim et al.

(10) Patent No.: US 9,773,672 B2
(45) Date of Patent: Sep. 26, 2017

(54) METHOD OF FORMING MICROPATTERNS

(71) Applicant: SAMSUNG ELECTRONICS CO., LTD., Suwon-si, Gyeonggi-do (KR)

(72) Inventors: Su-min Kim, Suwon-si (KR);
Hyun-woo Kim, Seongnam-si (KR);
Hyo-jin Yun, Suwon-si (KR);
Kyoung-seon Kim, Suwon-si (KR);
Hai-sub Na, Seoul (KR); Su-min Park, Seoul (KR); So-ra Han, Bucheon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/016,309

(22) Filed: Feb. 5, 2016

(65) Prior Publication Data

US 2016/0233083 A1   Aug. 11, 2016

(30) Foreign Application Priority Data

Feb. 9, 2015 (KR) .......................... 10-2015-0019667

(51) Int. Cl.
| | |
|---|---|
| *H01L 21/027* | (2006.01) |
| *H01L 21/033* | (2006.01) |
| *H01L 21/311* | (2006.01) |
| *H01L 21/3105* | (2006.01) |
| *H01L 21/3213* | (2006.01) |
| *H01L 21/28* | (2006.01) |
| *H01L 21/02* | (2006.01) |

(52) U.S. Cl.
CPC ...... *H01L 21/0276* (2013.01); *H01L 21/0273* (2013.01); *H01L 21/0337* (2013.01); *H01L 21/28273* (2013.01); *H01L 21/31058* (2013.01); *H01L 21/31144* (2013.01); *H01L 21/32139* (2013.01); *H01L 21/02164* (2013.01); *H01L 21/02222* (2013.01); *H01L 21/02282* (2013.01); *H01L 21/02326* (2013.01)

(58) Field of Classification Search
CPC ...................... H01L 21/0276; H01L 21/31058
USPC ......................................................... 438/703
See application file for complete search history.

(56) References Cited

U.S. PATENT DOCUMENTS

| | | | |
|---|---|---|---|
| 7,226,721 B2 | 6/2007 | Takei et al. | |
| 8,338,079 B2 | 12/2012 | Bae et al. | |
| 8,338,083 B2 | 12/2012 | Bae et al. | |
| 8,394,571 B2 | 3/2013 | Bae et al. | |
| 8,431,329 B2 | 4/2013 | Bae et al. | |
| 8,465,901 B2 | 6/2013 | Bae et al. | |

(Continued)

FOREIGN PATENT DOCUMENTS

| | | |
|---|---|---|
| JP | 4400572 B2 | 1/2010 |
| JP | 2011-109059 A | 6/2011 |

(Continued)

*Primary Examiner* — Moazzam Hossain
*Assistant Examiner* — Omar Mojaddedi
(74) *Attorney, Agent, or Firm* — Lee & Morse, P.C.

(57) ABSTRACT

A method of manufacturing a semiconductor device, including forming an etching target film on a substrate; forming an anti-reflection film on the etching target film; forming a photoresist film on the anti-reflection film; exposing the photoresist film; performing heat treatment on the anti-reflection film and the photoresist film to form a covalent bond between the anti-reflection film and the photoresist film; and developing the photoresist film.

16 Claims, 29 Drawing Sheets

(56) References Cited

U.S. PATENT DOCUMENTS

| | | |
|---|---|---|
| 8,492,068 B2 | 7/2013 | Bae et al. |
| 8,492,075 B2 | 7/2013 | Bae et al. |
| 8,507,185 B2 | 8/2013 | Bae et al. |
| 8,632,948 B2 | 1/2014 | Padmanaban et al. |
| 8,808,808 B2 | 8/2014 | Xu et al. |
| 8,846,195 B2 | 9/2014 | Xu et al. |
| 2007/0196763 A1 | 8/2007 | Araki et al. |
| 2009/0139568 A1* | 6/2009 | Weidman ........ H01L 31/022425 136/256 |
| 2012/0219901 A1 | 8/2012 | Bae et al. |
| 2013/0069246 A1* | 3/2013 | Bae ................... G03F 7/0035 257/774 |
| 2015/0162526 A1* | 6/2015 | Lee .................... H01L 43/08 438/3 |
| 2015/0309410 A1* | 10/2015 | Rahman ............... G03F 7/091 430/325 |

FOREIGN PATENT DOCUMENTS

| | | |
|---|---|---|
| JP | 2014-006403 A | 1/2014 |
| JP | 2014-141455 A | 8/2014 |
| KR | 10-2009-0067767 A | 6/2009 |
| KR | 10-2012-0099406 A | 9/2012 |

* cited by examiner

METHOD OF FORMING MICROPATTERNS

CROSS-REFERENCE TO RELATED APPLICATION

Korean Patent Application No. 10-2015-0019667, filed on Feb. 9, 2015, in the Korean Intellectual Property Office, and entitled: "Method of Forming Micropatterns," is incorporated by reference herein in its entirety.

BACKGROUND

Embodiments relate to a method of forming micropatterns.

SUMMARY

Embodiments may be realized by providing a method of manufacturing a semiconductor device, the method including forming an etching target film on a substrate; forming an anti-reflection film on the etching target film; forming a photoresist film on the anti-reflection film; exposing the photoresist film; performing heat treatment on the anti-reflection film and the photoresist film to form a covalent bond between the anti-reflection film and the photoresist film; and developing the photoresist film.

The covalent bond may be formed between a first material derived from the anti-reflection film and a second material derived from the photoresist film.

The first material may be a material having a hydroxy group (—OH) or an amine group (—NH$_2$), or a material capable of generating an amine group (—NH$_2$) by reacting with light.

The material capable of generating the amine group may be one or more of a cabamate, an aminoketone, an ammonium salt, an amide, an imine, an isocyanate, or an imide.

The second material may have a carboxy group (—COOH).

The method may further include performing heat treatment on the anti-reflection film before forming the photoresist film.

The photoresist film may include a polymer material that is deprotected by the exposing to form a carboxyl group.

A light source for the exposing may be a light source emitting an ArF excimer laser (193 nm), an F$_2$ excimer laser (157 nm), or extreme ultraviolet (EUV) (13.5 nm).

The photoresist film may be developed using a negative tone developer.

Embodiments may be realized by providing a method of forming micropatterns, the method including forming an etching target film on a substrate; forming an anti-reflection film including a collapse preventing agent on the etching target film; forming a photoresist film on the anti-reflection film; exposing the photoresist film; performing heat treatment on the anti-reflection film and the photoresist; and developing the photoresist film.

The collapse preventing agent may be a material having a hydroxy group (—OH) or an amine group (—NH$_2$), or a material capable of generating an amine group (—NH$_2$) by reacting with light.

The material capable of generating the amine group may be one or more of a cabamate, an aminoketone, an ammonium salt, an amide, an imine, an isocyanate, or an imide.

The photoresist film may include a photosensitive component having an ester group (—COO—).

The photosensitive component may be a material capable of forming a covalent bond with the collapse preventing agent through the heat treatment.

The photosensitive component may be a material that is deprotected by the exposing to form a carboxy group.

Embodiments may be realized by providing a method of manufacturing a semiconductor device, the method including forming an etching target film on a substrate; forming an anti-reflection film on the etching target film; forming a photoresist film on the anti-reflection film; exposing the photoresist film corresponding to a pattern; performing heat treatment on the anti-reflection film and the photoresist film; removing a non-exposure portion of the photoresist film to form the pattern; forming a spacer having an etch selectivity on a sidewall of the pattern; removing the pattern; and patterning the etching target film by using the spacer as an etching mask.

A covalent bond may be formed between the anti-reflection film and the photoresist film by the heat treatment.

The covalent bond may be formed in the form of an ester group (—COO—) or an amide group (—CONH).

The heat treatment may be performed on the anti-reflection film and the photoresist film at a temperature of about 85° C. to about 150° C. for about 30 seconds to about 30 minutes.

The anti-reflection film may include a pattern collapse preventing agent, the pattern collapse preventing agent may be a $C_{10}$-$C_{1000}$ hydrocarbon compound, and the pattern collapse preventing agent may be a compound having a hydroxy group (—OH) or an amine group (—NH$_2$), or a compound capable of generating a amine group (—NH$_2$) by reacting with light.

BRIEF DESCRIPTION OF THE DRAWINGS

Features will become apparent to those of skill in the art by describing in detail exemplary embodiments with reference to the attached drawings in which:

FIG. 10 illustrates a block diagram of a memory system, including the IC device manufactured by the method of

DETAILED DESCRIPTION

Figure 1:
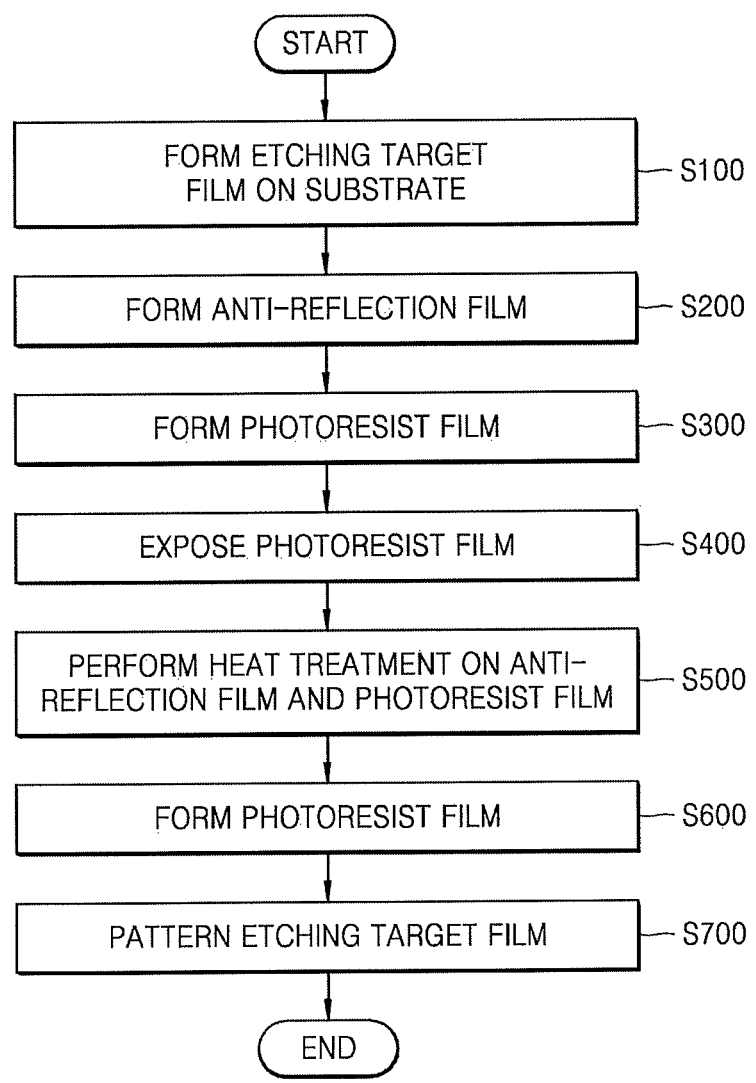
FIG. 1 illustrates a flowchart of a method of forming micropatterns, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, the term "and/or" includes any and all combinations of one or more of the associated listed. Expressions such as "at least one of" when preceding a list of elements, modify the entire list of elements and do not modify the individual elements of the list.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a flowchart of a method of forming micropatterns, according to an exemplary embodiment, and FIGS. 2A to 2G illustrate side cross-sectional views of a method of forming micropatterns, according to an exemplary embodiment.

Figure 2A:
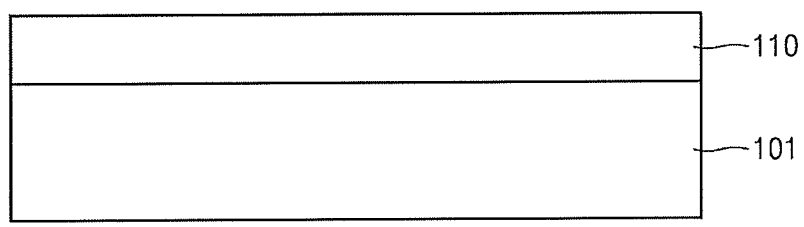
FIGS. 2A to 2G illustrate side cross-sectional views of a method of forming micropatterns, according to an exemplary embodiment.

Referring to FIGS. 1 and 2A, an etching target film 110, for example, a film to be etched, may be formed on a substrate 101 (S100).

The substrate 101 may include silicon, for example, crystalline silicon or polycrystalline silicon, or amorphous silicon. In some exemplary embodiments, the substrate 101 may include a semiconductor such as germanium (Ge), or a compound semiconductor such as silicon germanium (SiGe), silicon carbide (SiC), gallium arsenide (GaAs), indium arsenide (InAs), or indium phosphide (InP). In some exemplary embodiments, the substrate 101 may have a silicon-on-insulator (SOI) structure. For example, the substrate 101 may include a buried oxide (BOX) layer. In some exemplary embodiments, the substrate 101 may include a conductive region, for example, an impurity-doped well or an impurity-doped structure.

Semiconductor devices such as transistors or diodes may be formed on the substrate 101. Furthermore, a plurality of wirings may be arranged in a multi-layer on the substrate 101, and the wirings may be electrically separated from one another by an interlayer insulating layer.

The etching target film 110 may include one of a conductive film, a dielectric film, an insulation film, or a combination thereof. For example, the etching target film 110 may include one of a metal, an alloy, a metal carbide, a metal nitride, a metal oxynitride, a metal oxycarbide, a semiconductor, a polysilicon, an oxide, a nitride, an oxynitride, or a combination thereof.

Figure 2B:
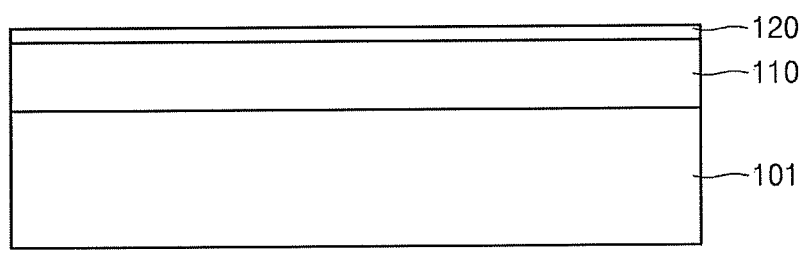

Referring to FIGS. 1 and 2B, an anti-reflection film 120 may be formed on the etching target film 110 (S200).

The anti-reflection film 120 may prevent total reflection of light in a subsequent exposure process. In some exemplary embodiments, the anti-reflection film 120 may be formed of an anti-reflective coating (ARC) material for a KrF excimer laser, an ArF excimer laser, or other light source. The anti-reflection film 120 may be formed of an ARC material used in a dry lithography process or an ARC material used in an immersion lithography process.

The anti-reflection film 120 may include an organic component having a light absorption structure and a solvent for dispersing the organic component. The light absorption structure may be, for example, a hydrocarbon compound having one or more benzene rings or a structure in which benzene rings are fused.

The organic compound having the light absorption structure may be, for example, a $C_{10}$-$C_{1000}$ hydrocarbon compound having one or more benzene rings. In some exemplary embodiments, the organic component may be a polymer material having a benzene ring in a repeating unit.

In some exemplary embodiments, the organic component may be a $C_{12}$-$C_{100}$ hydrocarbon compound in which two or more benzene rings are fused.

For example, the organic component having the light absorption structure may be a polyhydroxystyrene-based polymer, a polyvinyl phenol-based polymer, a polynorbornene-based polymer, a polyamide-based polymer, a polyimide-based polymer, a polyacrylate-based polymer, a poly(meth)acrylate-based polymer, or a polyfluorine-based polymer.

The solvent may include, for example, one of propylene glycol monomethyl ether acetate, propylene glycol monoethyl ether acetate, isobutyl acetate, butyrolactone, cyclohexanone, propylene glycol monomethyl ether, propylene glycol monoethyl ether, 2-ethoxyethyl acetate, 2-methoxyethyl acetate, tetrahydrofuran, 1,4-dioxane, ethyl lactate, methyl propionate, methyl ethyl ketone, 1,2-dichlorobenzene, propylene glycol butyl ether, ethyl 2-oxopropanoate, ethylcellosolve acetate, ethylene glycol butyl ether, ethylene glycol methyl ether acetate, ethylene glycol ethyl ether, diethylene glycol dimethyl ether, amyl acetate, diacetoneralcohol, ethyl-n-butyl ketone, or 2-heptanone.

The anti-reflection film 120 may further include a cross-linker agent. The cross-linker may be included in about 0.5 parts to 10 parts by weight with respect to 100 parts by weight of the organic component having the light absorption structure. When the content of the cross-linker is excessively small, a complete cross-linking may not be performed, and the anti-reflection film 120 may be partially mixed with a photoresist through counter diffusion in a subsequent photoresist coating process. When the content of the cross-linker is excessively large, the cross-linker may exist in an unreacted unimolecular state, and the anti-reflection film 120 may not meet required physical properties.

The cross-linker may be, for example, one of tris(2,3-epoxypropyl)-isocyanurate, trimethylol methane triglycidyl ether, trimethylolpropane triglycidyl ether, hexamethyl melamine, triethyl ethane triglycidyl ether, hexamethoxymethylmelamine, hexamethoxyethylmelamine, tetramethylol 2,4-diamino-1,3,5-triazine, tetramethoxy methyl 2,4-diamino-1,3,5-triazine, tetramethylol glycoluril, tetramethoxy methyl glycoluril, tetramethoxy ethyl glycoluril, tetramethylol urea, tetramethoxy methyl urea, tetramethoxy ethyl urea, or tetramethoxy ethyl 2,4-diamino-1,3,5-triazine.

The anti-reflection film 120 may further include an acid generator. The acid generator may function as a cross-linking catalyst and may be included in about 0.1 parts to about 3 parts by weight with respect to 100 parts by weight of the organic component having the light absorption structure. When the content of the acid generator agent is excessively small, a lower portion of a pattern may become wide, and footing phenomenon may be caused, which may make it difficult to form the pattern. When the content of the acid generator is excessively large, the lower portion of the pattern may become narrow, and under-cut may be caused. For example, the pattern may be collapsed, e.g., may collapse.

The acid generator may include, for example, one of a p-toluenesulfonic acid, tetramethoxy methyl glycoluril, a 2,2-dimethyl-1,3-dioxolane-4-yl-methyl p-toluenesulfonic acid, a p-toluenesulfonic acid, a pyridine p-toluenesulfonic acid, a 2-nitrobenzyl 4-methylbenzene acid, 2-hydroxycyclohexyl, a p-toluenesulfonic acid, pyridinium, a 4-methyl-benzenesulfonic acid, 2,4,4,6-tetrabromo-2,5-cyclohexadienone, a trifluoromethane sulfonic acid, or a mixture thereof.

The anti-reflection film 120 may further include a pattern collapse preventing agent. The pattern collapse preventing agent may be a $C_{10}$-$C_{1000}$ hydrocarbon compound and may be a compound having a hydroxyl group (—OH), a compound having am amine group (—$NH_2$), or a compound capable of generating an amine group through irradiation of light.

The compound capable of generating the amine group through the irradiation of light may be one of a cabamate, an aminoketone, an ammonium salt, an amide, an imine, an isocyanate, an imide, or a mixture thereof.

The pattern collapse preventing agent may be included in about 0.5 parts to about 10 parts by weight with respect to 100 parts by weight of the organic compound having the light absorption structure. As described below, the pattern collapse preventing agent may form a covalent bond with a photoresist film coated thereon through exposure. When the content of the pattern collapse preventing agent is excessively small, the covalent bond may be less formed and the effect of preventing the pattern collapse may be lowered. When the content of the pattern collapse preventing agent is excessively large, physical properties required as the anti-reflection film 120 may not met.

The anti-reflection film 120 may be formed, for example, by spin coating.

After that, a heat treatment may be performed on the anti-reflection film 120. A solvent in the anti-reflection film 120 may be considerably removed through the heat treatment. The organic component having the light absorption structure of the anti-reflection film 120 may be cross-linked by the cross-linker. The heat treatment may be performed at a temperature of about 150° C. to about 250° C. for about 10 seconds to about 300 seconds.

Figure 2C:
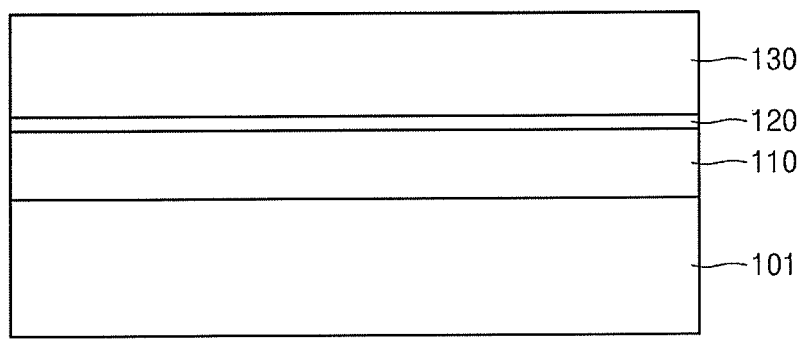

Referring to FIGS. 1 and 2C, a photoresist film 130 may be formed on the anti-reflection film 120.

The photoresist film 130 may be formed by spin coating, spray coating, or deep coating. The photoresist film 130 may be formed to have a thickness of about 30 nm to about 150 nm. After the photoresist film 130 is formed, a soft bake process may be performed at a temperature of about 80° C. to about 130° C. for about 40 seconds to about 100 seconds.

The photoresist film 130 may include a polymer material capable of chemically reacting with the pattern collapse preventing agent of the anti-reflection film 120 after being deprotected by an exposure process.

In the exemplary embodiment, a photosensitive component of the photoresist film 130 may be a photosensitive polymer including an ester group (—COO—). For example, the photosensitive polymer may include an ester group in which a protecting group is bonded to each repeating unit. As described below, the ester group, to which the protecting group is bonded, may be converted into a carboxy group (—COOH—) by an acid generated through irradiation of light.

The photosensitive polymer may be, for example, a (meth)acrylate-based polymer. The (meth)acrylate-based polymer may be an aliphatic (meth)acrylate-based polymer; examples of the (meth)acrylate-based polymer may include poly(methyl methacrylate) (PMMA), poly(t-butyl methacrylate), poly(methacrylic acid), poly(norbornyl methacrylate)), binary or ternary copolymers of repeating units of the (meth)acrylate-based polymers, or a combination thereof. The protecting group may be decomposed by an acid. The protecting group may be, for example, one of tert-butoxycarbonyl (t-BOC), iso-norbornyl, 2-methyl-2-adamantyl, 2-ethyl-2-adamantyl, 3-tetrahydrofuranyl, 3-oxocyclohexyl, γ-butyllactone-3-yl, mavaloniclactone, γ-butyrolactone-2- yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-buthoxycarbonylmethyl, methoxymethyl, ethoxymethyl, trimethoxysilyl, or triethoxysilyl.

Figure 2D:
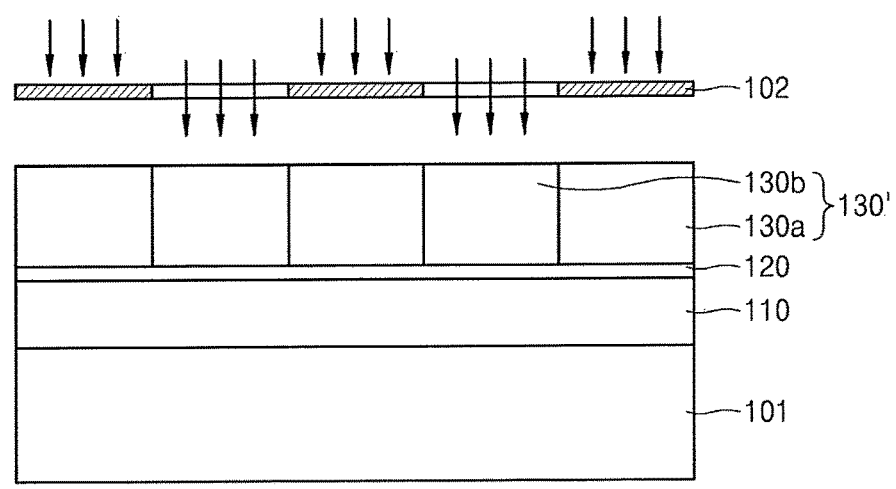

Referring to FIGS. 1 and 2D, the photoresist film 130 may be exposed by using an exposure mask 102 (S400).

A light source for the exposure may be a light source capable of emitting a KrF excimer laser (248 nm), an ArF excimer laser (193 nm), an $F_2$ excimer laser (157 nm), or extreme ultraviolet (EUV) (13.5 nm).

A material such as a photo-acid generator (PAG) may be contained in a commercially available positive photoresist material. An acid may be generated by the exposure and the protecting group bonded to the photosensitive polymer may be deprotected by the action of the acid. In the exemplary embodiment, since the protecting group is deprotected by the exposure, a carboxy group bonded to the photosensitive polymer may be formed.

The exposed photoresist film 130' may be divided into an exposure portion 130b and a non-exposure portion 130a. In the exposure portion 130b, light passing through a transparent portion of the exposure mask 102 may generate an acid from the PAG and may deprotect the photosensitive polymer accordingly. In the non-exposure portion 130a, light may be blocked by an opaque portion of the exposure mask 102 and no deprotection may occur accordingly.

An ester group (—COOR) before exposure may be converted into a carboxy group (—COOH) by the deprotection of the photosensitive polymer. The R bonded to the ester group may be the above-described protecting group.

Figure 2E:
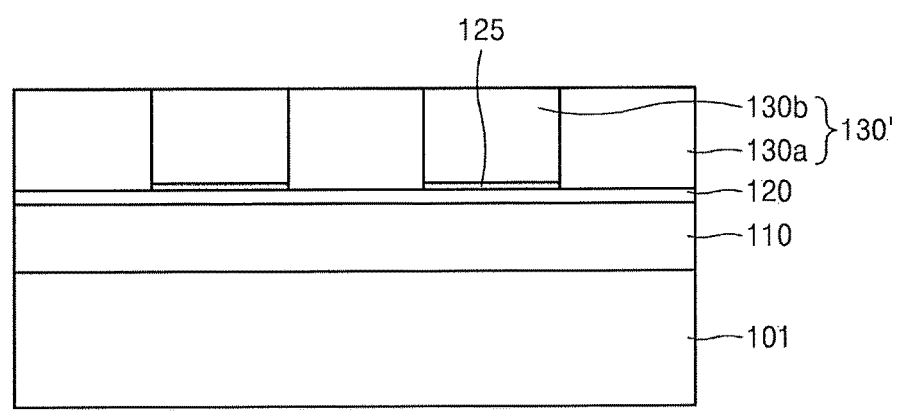

Referring to FIGS. 1 and 2E, heat treatment may be performed on the anti-reflection film 120 and the photoresist film 130 (S500).

A carboxy group existing in the photoresist film 130 may react with a hydroxyl group or an amine group existing in the pattern collapse protecting agent of the anti-reflection film 120 through the heat treatment, and a covalent bond may be formed. The covalent bond may be, for example, an ester (—COO—) bond or an amide bond.

The covalent bond may form a covalent bond layer 125 by a material diffusion and a chemical reaction between the anti-reflection film 120 and the photoresist film 130. The pattern collapse preventing agent derived from the anti-reflection film 120 and the photosensitive polymer derived from the photoresist film 130 may form a covalent bond, and a covalently-bonded material layer may be formed between the anti-reflection film 120 and the photoresist film 130. The covalent bond layer 125 may be a single-molecular layer. In an embodiment, the covalent bond layer 125 may have a thickness of several nm to several tens of nm.

The heat treatment for the covalent bond may be performed at a temperature of about 85° C. to about 150° C. for about 30 seconds to about 30 minutes.

FIG. 2E illustrates that in an exemplary embodiment, an aspect ratio may not be so large when the exposure portion 130b is viewed from side. In an exemplary embodiment, the exposure portion 130b may have an extremely high aspect ratio. For example, the aspect ratio of the exposure portion 130b may be about 3 to about 50.

Figure 2F:
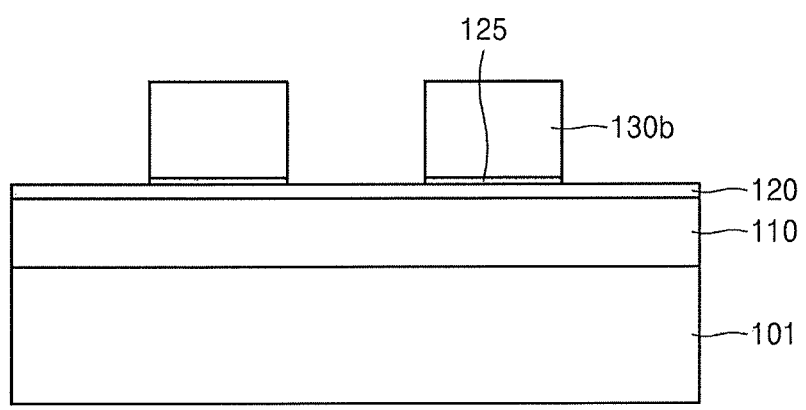

Referring to FIGS. 1 and 2F, the photoresist film 130' may be developed (S600).

The photoresist film 130' may be developed by using an organic solvent. The organic solvent may include a negative tone developer capable of selectively removing a soluble region of the photoresist pattern. The organic solvent may include a non-polar solvent. Examples of the organic solvent may include aromatic hydrocarbon, cyclohexane, cyclohexanone, cyclic or acyclic ethers, acetates, propionates, butyrates, lactates, and a combination thereof. Examples of the organic solvent may include n-butyl acetate (nBA), propylene glycol methyl ether (PGME), propylene glycol methyl ether acetate (PGMEA), γ-butyrolactone (GBL), and isopropanol (IPA).

When the negative tone developer is used as a developer, the exposure portion 130b may remain and the non-exposure portion 130a may be removed. The anti-reflection film 120 may remain on the etching target film 110 without being removed by the developer.

The covalent bond layer 125 may exist between the exposure portion 130b and the anti-reflection film 120, and the pattern may not collapse in a lateral direction and the pattern may be supported by the covalent bond layer 125, even when the aspect ratio of the pattern is high. A bonding force between the pattern made of the photoresist film 130 of the exposure portion 130b and the anti-reflection film 120 may be weak, and the covalent bond layer 125 may prevent the photoresist film 130 from collapsing.

Figure 2G:
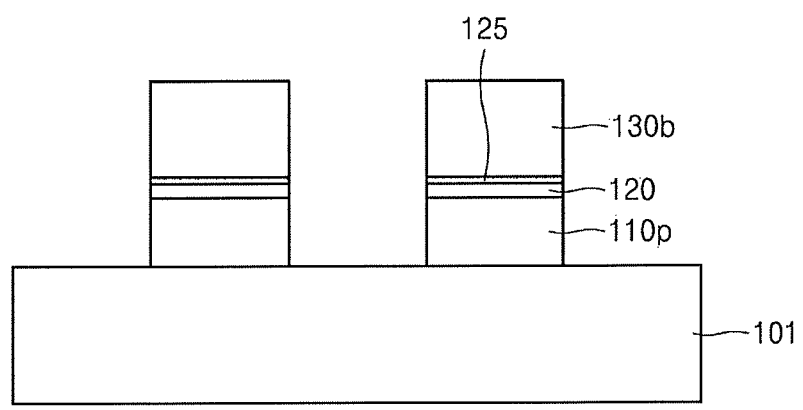

Referring to FIGS. 1 and 2G, the etching target film 110 may be patterned through anisotropic etching by using the photoresist film 130 of the exposure portion 130b as an etching mask, and micropatterns 110p may be formed (S700). The exposed anti-reflection film 120 may be removed. The etching target film 110 may be patterned through, for example, plasma etching, reactive ion etching (RIE), or ion beam etching.

After that, the photoresist film 130 of the exposure portion 130b, the covalent bond layer 125, and the anti-reflection film 120 on the micropatterns 110p may be removed, and the micropatterns 110p may be obtained.

The micropatterns 110p obtained after etching the etching target film 110 may constitute various elements necessary for implementing the integrated circuit device. For example, the micropatterns 110p may be an active region defined in a substrate of a semiconductor device. In an exemplary embodiment, the micropatterns 110p may include a plurality of contact hole patterns or a plurality of line-and-space patterns. In an exemplary embodiment, the micropatterns 110p may include conductive patterns or insulating pattern. For example, the conductive patterns may include a plurality of patterns for forming bit lines, a plurality of patterns for forming direct contacts, a plurality of patterns for forming buried contacts, and a plurality of patterns for forming lower electrodes of capacitors, all of which may be disposed in a cell array region of the integrated circuit device, or a plurality of conductive patterns disposed in a core region of the integrated circuit device.

Figure 3:
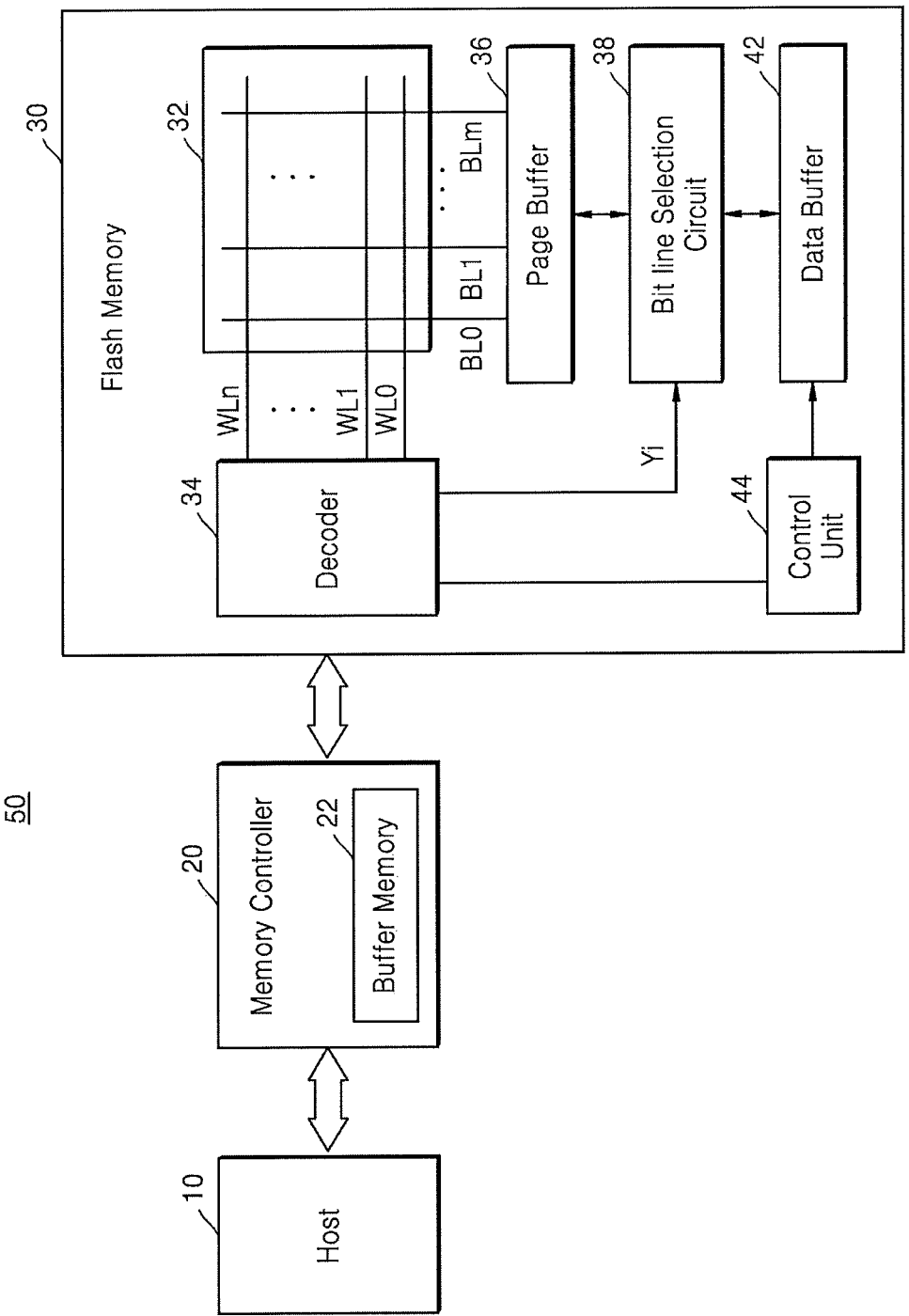
FIG. 3 illustrates a block diagram of a memory system of a semiconductor device manufactured by the method of forming micropatterns, according to an exemplary embodiment.

FIG. 3 illustrates a block diagram of a memory system 50 of a semiconductor device which may be manufactured by a method of forming micropatterns, according to an exemplary embodiment.

Referring to FIG. 3, the memory system 50 of the semiconductor device may include a host 10, a memory controller 20, and a flash memory 30.

The memory controller 20 may operate as an interface between the host 10 and the flash memory 30. The memory controller 20 may include a buffer memory 22. The memory controller 20 may further include a central processing unit (CPU), a read-only memory (ROM), a random-access memory (RAM), and interface blocks.

The flash memory 30 may further include a cell array 32, a decoder 34, a page buffer 36, a bit line selection circuit 38, a data buffer 42, and a control unit 44.

Data and a write command may be input from the host 10 to the memory controller 20, and the memory controller 20 may control the flash memory 30 to write data to the cell array 32 according to the write command. The memory controller 20 may control the flash memory 30 to read the data stored in the cell array 32 according to a read command input from the host 10. The buffer memory 22 may temporarily store data that may be transmitted between the host 10 and the flash memory 30.

The cell array 32 of the flash memory 30 may include a plurality of memory cells. The decoder 34 may be connected to the cell array 32 via word lines $WL_0, WL_1, \ldots, WL_n$. The decoder 34 may receive an address from the memory controller 20 to select one of the word lines $WL_0, WL_1, \ldots, WL_n$ or to generate a selection signal Yi so as to select one of a plurality of bit lines $BL_0, BL_1, \ldots, BL_m$. The page buffer 36 may be connected to the cell array 32 via the bit lines $BL_0, BL_1, \ldots, BL_m$.

Figure 4:
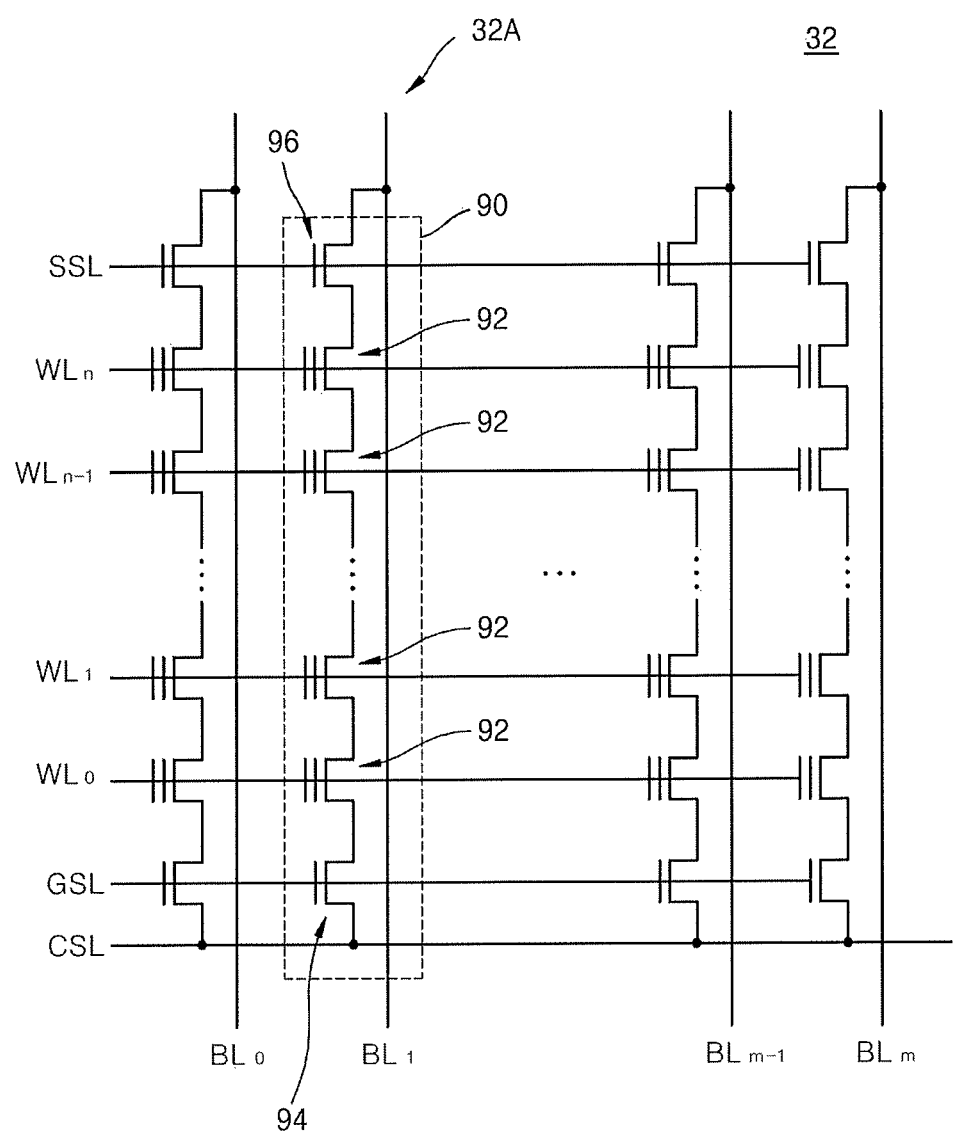
FIG. 4 illustrates a circuit diagram of a cell array of FIG. 3.

FIG. 4 illustrates a circuit diagram of the cell array 32. Referring to FIG. 4, the cell array 32 may include a plurality of memory cell blocks 32A each including a plurality of memory cells. The memory cell blocks 32A may each include a plurality of cell strings 90 each arranged between bit lines $BL_0, BL_1, \ldots, BL_m$ and a common source line CSL. The cell strings 90 may each include a plurality of memory cells 92 that may be connected serially. Gate electrodes of the plurality of memory cells 92 included in each cell string 90 may respectively be connected to different word lines $WL_0, WL_1, \ldots, WL_n$. A ground selection transistor 94 connected to a ground selection line GSL and a string selection transistor 96 connected to a string selection line SSL may respectively be arranged at two ends of the cell string 90. The ground selection transistor 94 and the string selection transistor 96 may control electrical connection between the plurality of memory cells 92 and the bit lines $BL_0, BL_1, \ldots, BL_m$ and the common source line CSL. The memory cells, which may be each connected to the same word lines $WL_0, WL_1, \ldots, WL_n$ across the cell strings 90, may form a page unit or a byte unit.

In a NAND flash memory device, contact pads used to connect the word lines $WL_0, WL_1, \ldots, WL_n$ to the decoder 34 may be connected to the word lines $WL_0, WL_1, \ldots, WL_n$ as a single unit, respectively. The contact pads each connected to the word lines $WL_0, WL_1, \ldots, WL_n$ may need to be formed at the same time with the word lines $WL_0, WL_1, \ldots, WL_n$. In regard to the NAND flash memory device, low density patterns having a relatively wider width, such as the ground selection line GSL, the string selection line SSL, and transistors for peripheral circuits, may need to be formed at the same time when forming the word lines $WL_0, WL_1, \ldots, WL_n$, which may have a relatively narrower width.

Figure 5:
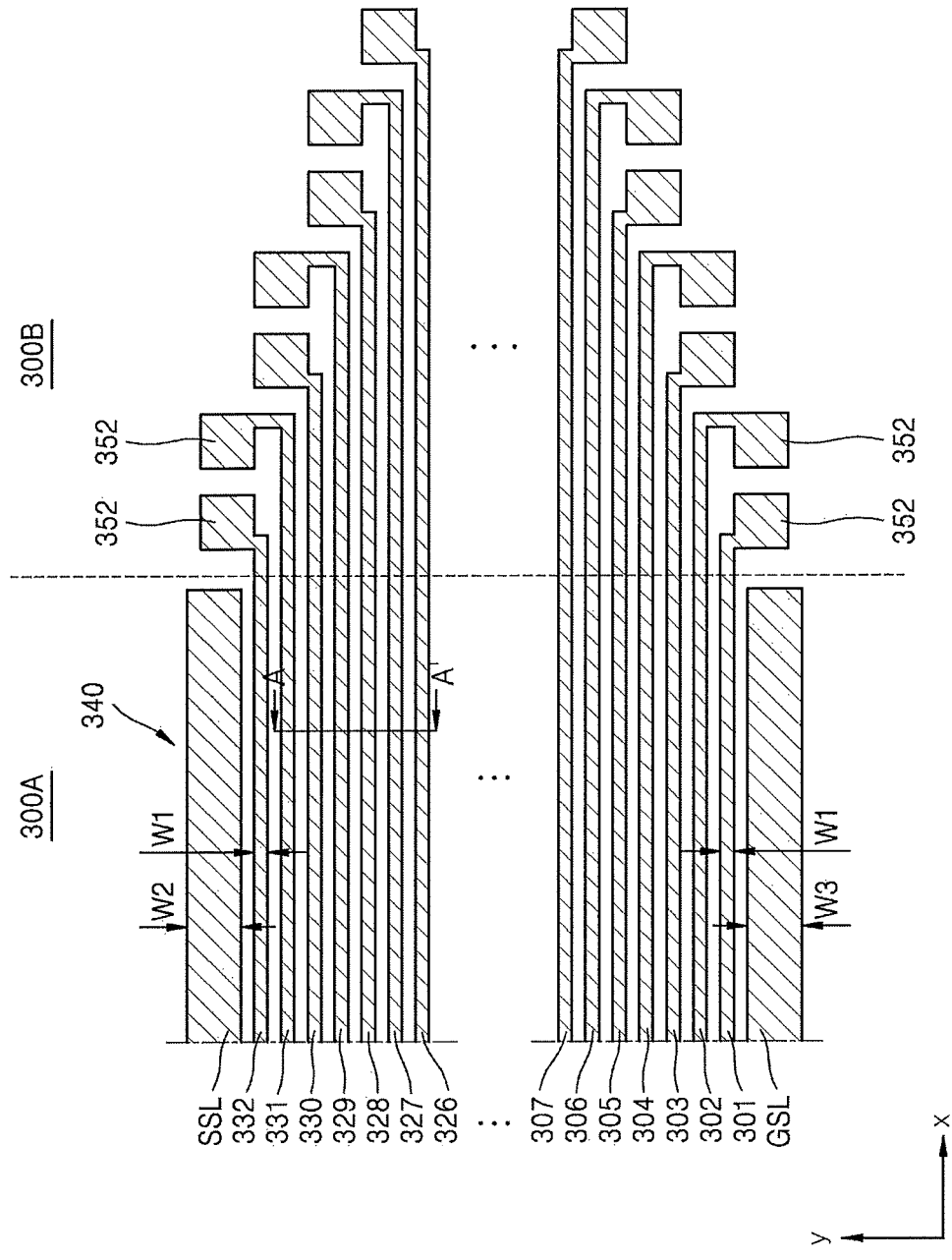
FIG. 5 illustrates a plan view of a semiconductor device manufactured by the method of forming micropatterns according to an exemplary embodiment.

FIG. 5 illustrates a partial plan view of a configuration of a semiconductor device which may be manufactured using a method of forming micropatterns according to an exemplary embodiment. FIG. 5 illustrates a layout of a portion of a memory cell area 300A of a NAND flash memory device and a connection area 300B for connecting a plurality of conductive lines constituting cell arrays of the memory cell area 300A, such as word lines or bit lines, to an external circuit such as a decoder.

Referring to FIG. 5, a plurality of memory cell blocks 340 may be formed in the memory cell area 300A. In FIG. 5, only one memory cell block 340 is illustrated for convenience of description. In the memory cell block 340, a plurality of conductive lines 301, 302, . . . , 332 that may be required to constitute one cell string 90 (see FIG. 4) between the string selection line SSL and the ground selection line GSL may extend in parallel to one another in a first direction (x-direction in FIG. 5). The plurality of conductive lines 301, 302, . . . , 332 may extend over both the memory cell area 300A and the connection area 300B.

In order to connect the plurality of conductive lines 301, 302, . . . , 332 to the external circuit such as a decoder, a plurality of contact pads 352 may respectively be formed at ends of the plurality of conductive lines 301, 302, . . . , 332 each as a single unit with the plurality of conductive lines 301, 302, . . . , 332.

In FIG. 5, the plurality of conductive lines 301, 302, . . . , 332, the string selection line SSL, the ground selection line GSL, and the contact pads 352 may all be formed of the same material. The plurality of conductive lines 301, 302, . . . , 332 may be word lines that constitute a plurality of memory cells in the memory cell area 300A. The string selection line SSL and the ground selection line GSL may have greater widths $W_2$ and $W_3$ than a width $W_1$ of the plurality of conductive lines 301, 302, . . . , 332.

According to an exemplary embodiment, the plurality of conductive lines 301, 302, . . . , 332 may be bit lines that constitute memory cells in the memory cell area 300A. The string selection line SSL and the ground selection line GSL may be omitted.

While the plurality of conductive lines 301, 302, . . . , 332 may be thirty-two conductive lines in the one memory cell block 340 illustrated in FIG. 5, one memory cell block 340 may include different numbers of conductive lines.

Hereinafter, a method of forming micropatterns of a semiconductor device according to an exemplary embodiment will be exemplarily described in detail.

FIGS. 6A to 6G illustrate cross-sectional views of a method of forming micropatterns, according to an exemplary embodiment. The cross-sectional views illustrated may correspond to a portion of the semiconductor device cut along a line A-A' of FIG. 5.

Figure 6A:
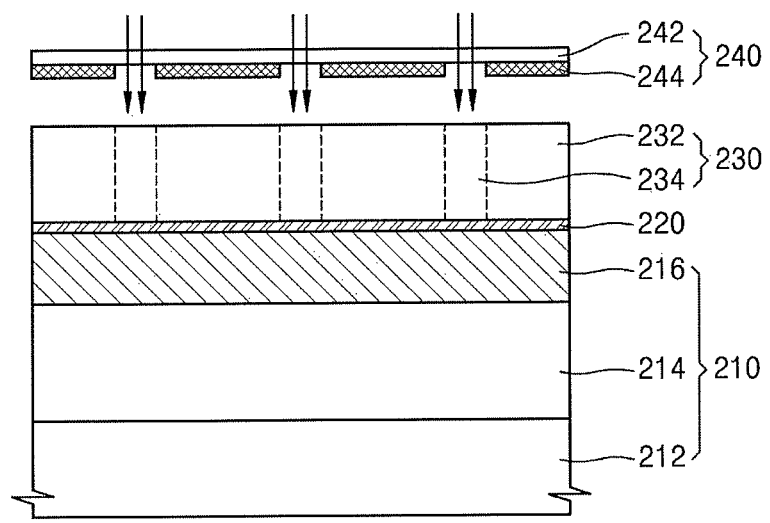
FIGS. 6A to 6H illustrate cross-sectional views of a method of forming micropatterns, according to an exemplary embodiment.

Referring to FIG. 6A, an anti-reflection film 220 and a photoresist 230 may sequentially be formed on a substrate 210. The anti-reflection film 220 and the photoresist 230 may be stacked using, for example, a spin coating method.

The substrate 210 may include a semiconductor substrate 212, a silicon oxide layer 214 formed on the semiconductor substrate 212, and a polysilicon layer 216 formed on the silicon oxide layer 214. The semiconductor substrate 212 may be a substrate formed of silicon, silicon carbide, silicon germanium, indium arsenide, indium phosphide, a gallium arsenide compound, or a gallium indium compound. The substrate 210 may further include at least one insulating layer and/or at least one semiconductor layer below the semiconductor substrate 212.

The anti-reflection film 220 may be formed at a thickness of about 20 nm to about 150 nm. Since the anti-reflection film 220 is described above, an additional description thereof will be omitted herein.

The photoresist 230 may be a positive photoresist and may include a photo-acid generator (PAG).

For example, the positive photoresist may be a resist for a KrF excimer laser (248 nm), a resist for an ArF excimer laser (193 nm), or a resist for an $F_2$ excimer laser (157 nm), or a resist for extreme ultraviolet (EUV) (13.5 nm). The positive photoresist may be, for example, a (meth)acrylate-based polymer. The (meth)acrylate-based polymer may be aliphatic (meth)acrylate polymer; examples of the (meth) acrylate polymer include poly(methyl methacrylate) (PMMA), poly(t-butyl methacrylate), poly(methacrylic acid), poly(norbornyl methacrylate), binary or ternary copolymers of repeating units of the (meth)acrylate-based homopolymers, a combination thereof and a mixture thereof. The (meth)acrylate-based polymers may be substituted with various acid-labile protecting groups. Examples of the protecting group include tert-butoxycarbonyl (t-BOC) group, tetrahydropyranyl group, trimethylsilyl group, phenoxyethyl group, cyclohexenyl group, tert-butoxycarbonyl methyl group, tert-butyl group, adamantly group, and norbornyl group.

The PAG may include a chromophore group and may generate an acid upon being exposed to light selected from a KrF excimer laser (248 nm), an ArF excimer laser (193 nm), an $F_2$ excimer laser (157 nm), or EUV (13.5 nm). Examples of the PAG include onium salt, halogenides, nitrobenzyl esters, alkyl sulfonates, diazonaphthoquinones, iminosulfonates, disulfones, diazomethanes, and sulfonyloxy ketones. Examples of the PAG include triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris (alkyl sulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornenedicarboximide nonaflate, triphenylsulfonium perfluorobutane sulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, and combinations thereof.

As illustrated in FIG. 6A, the photoresist 230 may be exposed by using an exposure mask 240 corresponding to a line-and-space pattern which is to be formed later. The exposure mask 240 may include, for example, a light-blocking layer 244 that may be adequately designed to have a line-and-space image on, for example, a quartz substrate 242. For example, the light-blocking layer 244 may be formed of chromium.

After the exposure, the photoresist 230 may be divided into an exposure portion 234 and a non-exposure portion 232 according to whether exposed to the light or not. An acid may be generated in the exposure portion 234 due to, for example, the exposure and the activation of the PAG, and no acid may be generated in the non-exposure portion 232 because it may not be exposed to light. Light used in the exposure may be a KrF excimer laser (248 nm), an ArF excimer laser (193 nm), an $F_2$ excimer laser (157 nm), or EUV (13.5 nm).

Figure 6B:
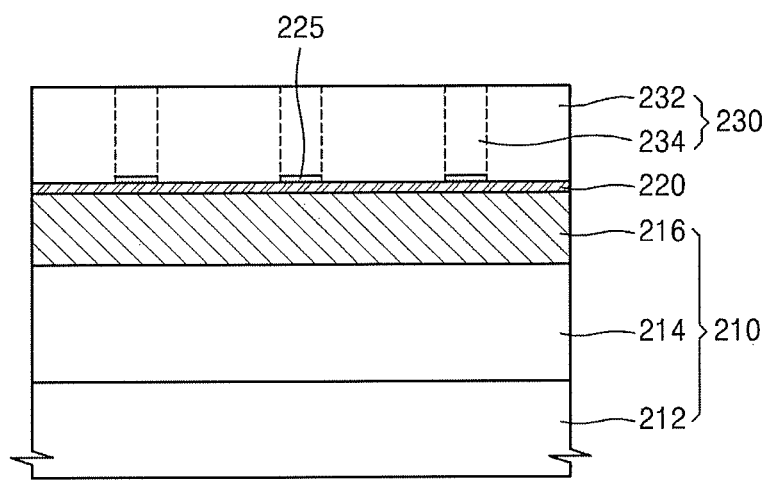

Referring to FIG. 6B, in order to form a covalent bond layer 225, heat treatment may be performed on the exposed photoresist 230 and anti-reflection film 220. The heat treatment condition may be substantially identical to that described above with reference to FIG. 2E.

After heat treatment, the covalent bond layer 225 may be formed only in the exposed region. When the photoresist 230 is a positive photoresist material film, the protecting group may be removed from the photosensitive polymer only in the exposed region and may form a covalent bond with a hydroxyl group or an amine group in the anti-reflection film 220.

Figure 6C:
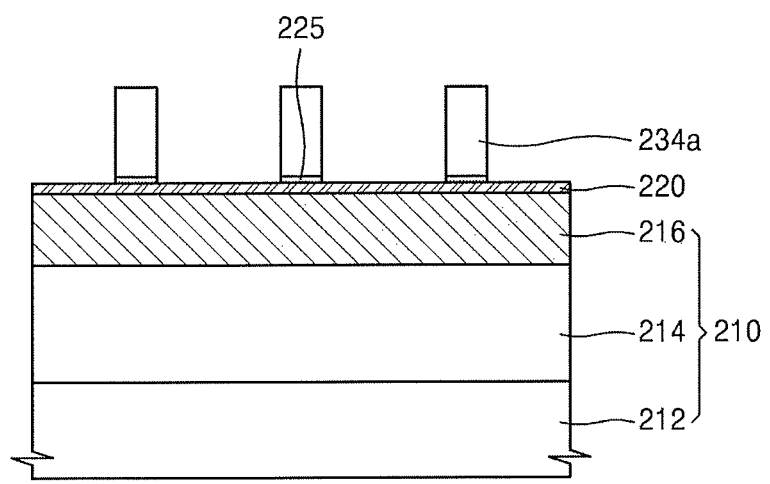

Referring to FIG. 6C, the non-exposure portion 232 of the photoresist 230 may be removed and the exposure portion 234 may remain. The anti-reflection film 220 may remain on the substrate 210.

In order to remove the non-exposure portion 232 of the photoresist 230, an organic solvent such as a negative tone developer may be used. The organic solvent may be different from a developing agent and may be a non-polar solvent; examples of the organic solvent are: aromatic hydrocarbons such as benzene, toluene, or xylene; cyclohexane or cyclohexanone; non-cyclic or cyclic ethers such as dimethyl ether, diethyl ether, ethylene glycol, propylene glycol, hexylene glycol, ethylene glycol monomethyl ether, ethylene glycol monoethyl ether, ethylene glycol methyl ethyl ether, diethylene glycol monomethyl ether, diethylene glycol monoethyl ether, diethylene glycol dimethyl ether, propylene glycol methyl ether, propylene glycol ethyl ether, propylene glycol propyl ether, propylene glycol butyl ether, tetrahydrofuran, or dioxane; acetates such as methyl acetate, ethyl acetate, propyl acetate, butyl acetate, methyl hydroxy acetate, ethyl hydroxy acetate, propyl hydroxy acetate, butyl hydroxy acetate, methylmethoxy acetate, ethylmethoxy acetate, propylmethoxy acetate, butylmethoxy acetate, methylethoxy acetate, ethylethoxy acetate, propylethoxy acetate, butylethoxy acetate, methylpropoxy acetate, ethylpropoxy acetate, propylpropoxy acetate, butylpropoxy acetate, methylbutoxy acetate, ethylbutoxy acetate, propylbutoxy acetate, butylbutoxy acetate, propylene glycol methyl ether acetate, propylene glycol ethyl ether acetate, propylene glycol propyl ether acetate, propylene glycol butyl ether acetate, methyl cellosolve acetate, or ethyl cellosolve acetate; propionates such as methyl 3-hydroxy propionate, ethyl 3-hydroxy propionate, propyl 3-hydroxy propionate, butyl 3-hydroxy propionate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, propylene glycol methyl ether propionate, propylene glycol ethyl ether propionate, propylene glycol propyl ether propionate, or propylene glycol butyl ether propionate; butyrates such as oxyisobutyric acid ester (e.g., methyl-2-hydroxyisobutyrate), methyl α-methoxyisobutyrate, ethyl methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl β-isopropoxyisobutyrate, ethyl 3-isopropoxyisobutyrate, isopropyl β-isopropoxyisobutyrate, butyl β-isopropoxyisobutyrate, methyl β-butoxyisobutyrate, ethyl β-butoxyisobutyrate, butyl β-butoxyisobutyrate, methyl α-hydroxyisobutyrate, ethyl α-hydroxyisobutyrate, isopropyl α-hydroxyisobutyrate or butyl α-hydroxyisobutyrate; lactates such as methyl lactate, ethyl lactate, propyl lactate, or butyl lactate; and a combination of these. For example, the negative tone developer may be n-butyl acetate.

Figure 6D:
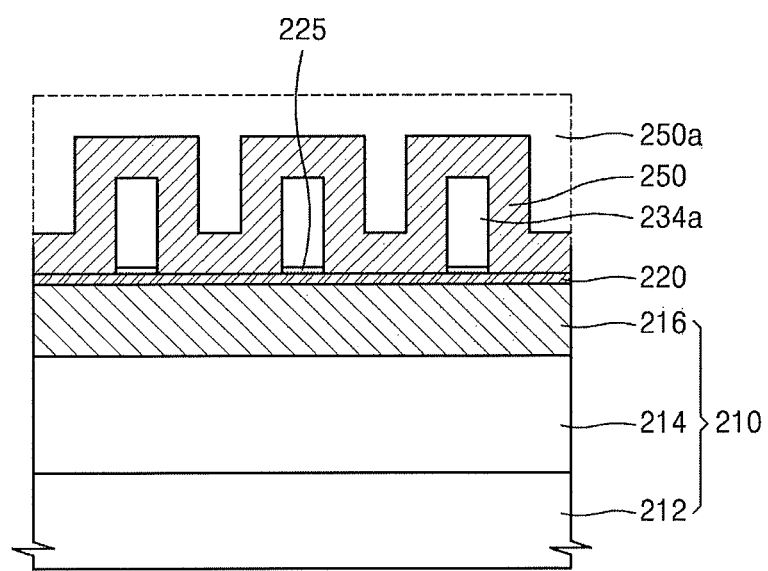

Referring to FIG. 6D, a spin-on-oxide (SOX) material may be formed on a sidewall of a line-and-space pattern 234a so as to form a spacer. The SOX material may be a silicon oxide, and in order to form a spacer formed of an SOX material on the sidewall of the line-and-space pattern 234a, a layer 250a formed of an SOX precursor material may first be formed on the sidewall of the line-and-space pattern 234a.

While the SOX material is exemplified as a material for forming the spacer, it will be understood by those skilled in the art that any material may be used as long as the material has sufficient etch selectivity to the photoresist.

The SOX precursor material may be a polysilazane compound and may include a compound such as perhydropolysilazane (PHPS). The polysilazane compound may have a general formula of —(SiH$_2$NH$_2$)n— (where n is a positive integer equal to or greater than 5), and two ends of the polysilazane molecule may be, for example, hydrogen-terminated. The polysilazane may be prepared by, for example, obtaining a complex by reacting halosilane with a Lewis base, and then reacting the complex with ammonia. For example, a halosilane such as SiCl$_4$ or SiH$_2$Cl$_2$ may be reacted with a Lewis base to obtain a silazane in the form of a complex, and the complex may be copolymerized to a polysilazane by using an alkali metal halogenide catalyst or a transition metal complex catalyst.

In order to form the layer 250a of the SOX precursor material, an upper portion of the line-and-space pattern 234a may be coated with a spin-on-glass (SOG) composition including a solvent and a polysilazane compound. The SOG composition may be coated by using, for example, a spin coating method or a dip coating method. A thickness of the SOG composition may be determined considering a height of the line-and-space pattern 234a or a thickness of a spacer that is to be formed.

Among the SOG composition, the content of the polysilazane compound may range from about 5 wt % to about 30 wt %, and the content of the solvent may range from about 70 wt % to about 95 wt %. The polysilazane compound may have a weight average molecular weight of about 1,000 to about 8,000.

Examples of solvents that can be used as the solvent of the SOG composition include toluene, benzene, xylene, dibutyl ether, dimethyl ether, diethyl ether, tetrahydrofuran, propylene glycol methoxy ether (PGME), propylene glycol monomethyl ether acetate (PGMEA), and hexane.

As illustrated in FIG. 6D, after forming the layer 250a of the SOX precursor material, the layer 250a may be baked at a temperature from about 50° C. to about 200° C. for about 10 seconds to about 5 minutes. The baking may be performed in an oxidizing atmosphere. During the baking, the SOX precursor material may be converted into a silicon oxide, and moreover, the SOX precursor material may react with an acid existing in the line-and-space pattern 234a at an interface between the layer 250a of the SOX precursor material and the line-and-space pattern 234a.

As described above, the exposure portion 234 of the positive photoresist 230 corresponding to the line-and-space pattern 234a of FIG. 6D may be rich in a hydroxyl group, a carboxy group, and/or a lactone group which may function as an acid, and these acids may combine with the SOX precursor material and the silicon oxide through the above-described reaction. The longer the reaction time, the more the acids may diffuse into the SOX precursor material/the silicon oxide. As the reaction time increases, a reaction area 250 may also be increased.

Then, by removing an unreacted SOX precursor material using a solvent, the reaction area 250 may remain as illustrated in FIG. 6D.

Figure 6E:
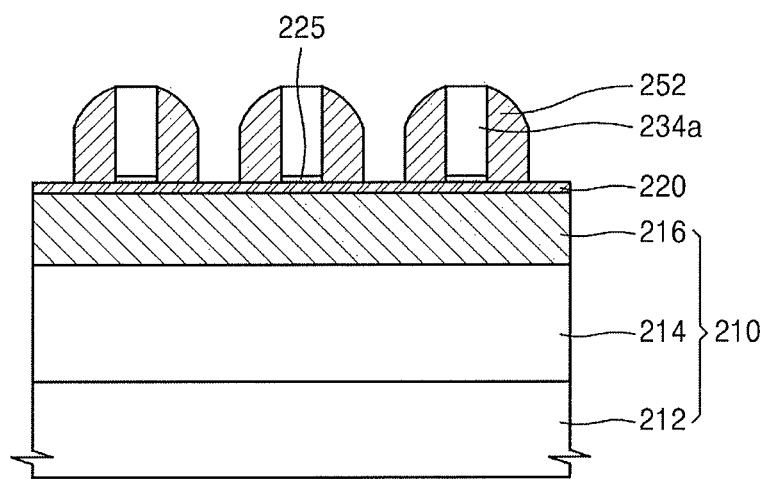

Referring to FIG. 6E, the reaction area 250 may be etched back to form a spacer 252. By using the etch-back operation, the SOX material covering an upper surface of the line-and-space pattern 234a may be removed, and the upper surface of the line-and-space pattern 234a may be exposed accordingly. When comparing FIGS. 6D and 6E, a width of the spacer 252 may be dependent on a thickness of the reaction area 250, and the width of the spacer 252 may be adjusted by controlling a baking time period. The thickness of the reaction area 250 may be adjusted by controlling the baking time period, and the width of the spacer 252 may also be adjusted.

Figure 6F:
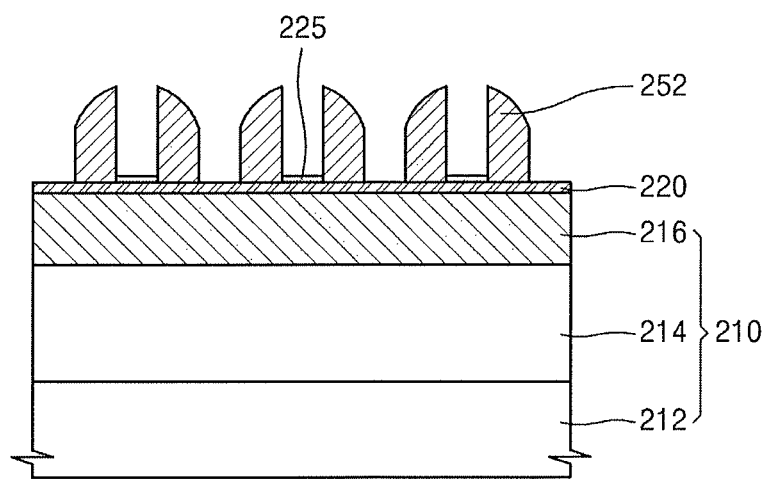

Referring to FIG. 6F, the line-and-space pattern 234a may be removed using a developing agent. A basic aqueous solution may be used as the developing agent; for example, a tetramethyl ammonium hydroxide (TMAH) aqueous solution may be used as the developing agent. A concentration of the TMAH aqueous solution may be from about 2 wt % to about 5 wt %.

Figure 6G:
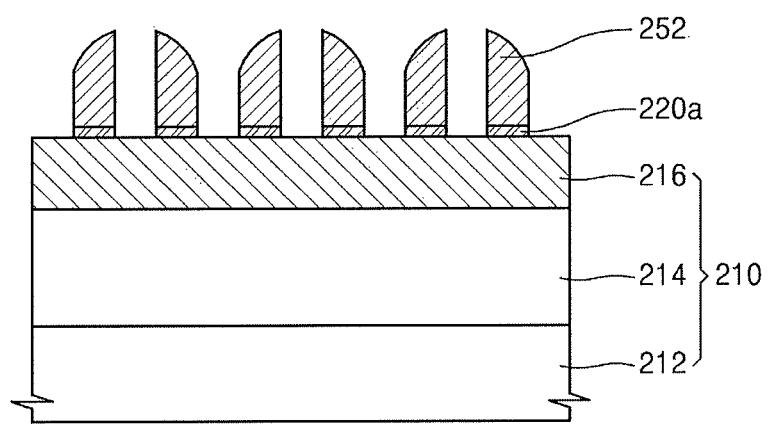

Referring to FIG. 6G, the covalent bond layer 225 and an exposed portion of the anti-reflection film 220 may be removed using an organic solvent. The organic solvent may be one of the non-polar organic solvents listed above. In an embodiment, the exposed portion of the anti-reflection film 220 may be removed using a polar organic solvent such as alcoholic solvents.

Figure 6H:
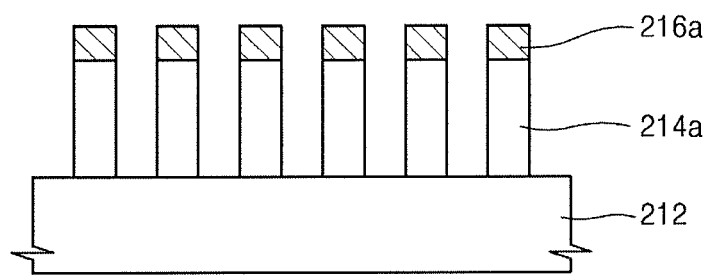

Then, as illustrated in FIG. 6H, the polysilicon layer 216 may be etched by using the spacer 252 and the anti-reflection film 220a as an etching mask to obtain a polysilicon micropattern 216a to which a pattern of the spacer 252 may be transferred. By etching the silicon oxide layer 214 using the polysilicon micropatterns 216a as an etching mask, silicon oxide micropatterns 214a to which the polysilicon micropattern 216a may be transferred may be obtained. A layer in which a micropattern is to be formed, for example, a target layer, may be the silicon oxide layer 214.

As can be seen from comparison of FIGS. 6A and 6H, a pattern density of the silicon oxide micropatterns 214a may be doubled compared to that of the line-and-space pattern 234a formed of the positive photoresist 230. To form the conductive lines 301, 302, . . . , 332 as illustrated in FIG. 3 by using the method of forming micropatterns as described above, a hard mask material layer may be formed on a conductive material and then the above-described method may be performed to form a hard mask, and then the conductive material may be etched by using the hard mask, and the conductive lines 301, 302, . . . , 332 may be formed.

The case in which the anti-reflection film 220 may not be developed by the basic aqueous solution has been described. A case in which an anti-reflection film 224 may be developable by a basic aqueous solution such as a TMAH aqueous solution will be described below. FIGS. 7A to 7G illustrate side cross-sectional views of a method of forming micropatterns by using a developable anti-reflection film 224, according to an exemplary embodiment. Hereinafter, the description provided above with reference to FIGS. 6A to 6H will not be repeated for conciseness.

Figure 7A:
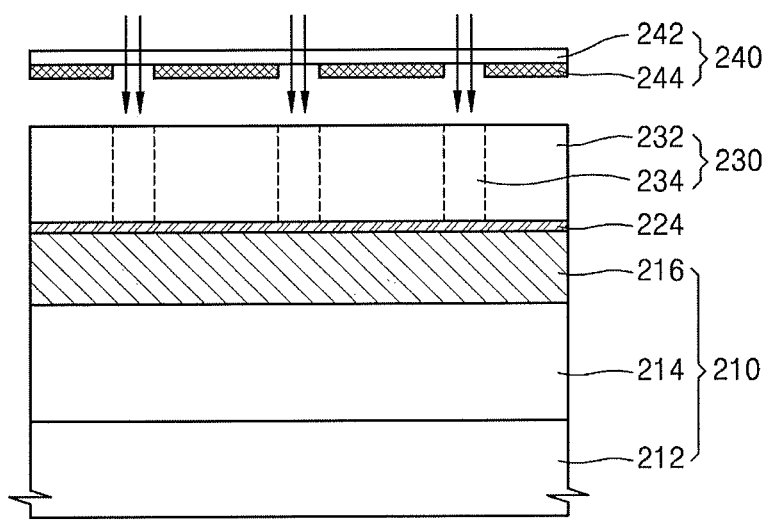
FIGS. 7A to 7G illustrate cross-sectional views of a method of forming micropatterns, according to an exemplary embodiment.

A semiconductor device of FIG. 7A may be substantially identical to the semiconductor device of FIG. 6A, except that the developable anti-reflection film 224 may be used instead of a typical anti-reflection film. The developable anti-reflection film 224 may include a polymer including a chromophore group, a cross-linker that may be linkable with the polymer through reaction with an acid, a PAG, a thermal-acid generator (TAG), and a solvent.

The polymer may be a polyhydroxystyrene (PHS) having a chromophore group. The chromophore group may be, for example, a $C_2$-$C_{10}$ alkyl ester group substituted with anthracene or a $C_2$-$C_{10}$ azo group.

The cross-linker may be a $C_4$-$C_{50}$ hydrocarbon compound having at least two double bonds at terminals.

Since the PAG has been described above in detail, a description thereof is omitted.

The TAG may be formed of an aliphatic or alicyclic compound. For example, the TAG may be formed of one or more compounds selected from a carbonate ester, a sulfonate ester, and a phosphate ester. For example, the TAG may be formed of one or more compounds selected from cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, and adamantyl nonafluorobutanephosphonate.

The aforementioned non-polar solvent may be used as the solvent, and a description thereof is omitted since it is already described above.

Referring to FIG. 7A, the developable anti-reflection film 224 may be soft-baked before subjecting a positive photoresist 230 to exposure using an exposure mask 240. Soft baking of the developable anti-reflection film 224 may be performed at a temperature from about 50° C. to about 150° C. for about 20 seconds to about 5 minutes. Through the soft baking, an acid may be generated from the TAG, and the cross-linker may be cross-linked with the polymer by the acid.

Next, the positive photoresist 230 may be exposed using the exposure mask 240. The exposure mask 240 may correspond to a line-and-space pattern that may be desired to form. After the exposure, the photoresist 230 may be divided into an exposure portion 234 and a non-exposure portion 232 according to whether exposed to the light or not.

An acid may be generated in the exposure portion 234 due to, for example, the exposure and the activation of the PAG, and no acid may be generated in the non-exposure portion 232 since it may not be exposed. Due to, for example, the acid generated in the exposure portion 234, the cross-linked developable anti-reflection film 224 disposed under the exposure portion 234 may be decross-linked, and may become developable again by a developing agent.

Figure 7B:
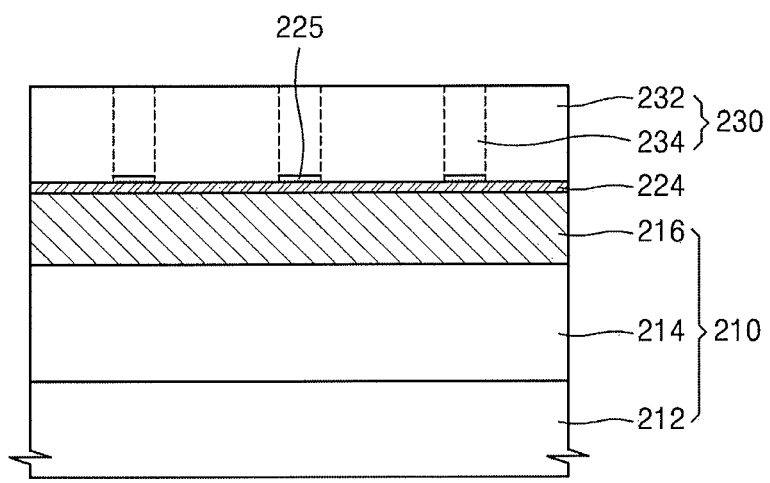

Referring to FIG. 7B, in order to form a covalent bond layer 225, heat treatment may be performed on the exposed photoresist 230 and the anti-reflection film 224. The heat treatment condition may be substantially identical to that described above with reference to FIG. 2E.

After the heat treatment, the covalent bond layer 225 may be formed on an exposed region. When the photoresist 230 is a positive photoresist material film, the protecting group may be removed from the photosensitive polymer and may form a covalent bond with a hydroxyl group or an amine group in the anti-reflection film 224.

Figure 7C:
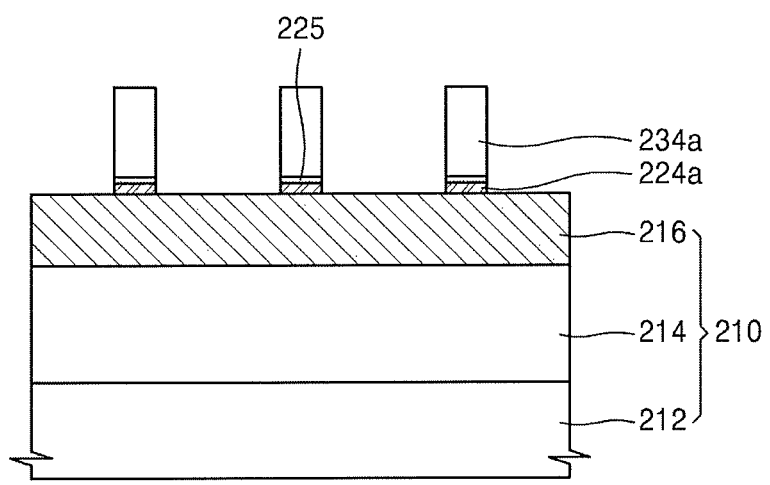

Referring to FIG. 7C, the non-exposure portion 232 of the photoresist 230 may be removed. In order to remove the non-exposure portion 232 of the photoresist 230, an organic solvent such as a negative tone developer may be used. Since the negative tone developer has been described above in detail, a description thereof is omitted. Unlike the anti-reflection film 220 of FIG. 6B, the anti-reflection film 224 disposed under the non-exposure portion 232 may be removed together with the non-exposure portion 232 by the organic solvent. An exposure portion 234a and an anti-reflection film 224a under the exposure portion 234a may remain.

Figure 7D:
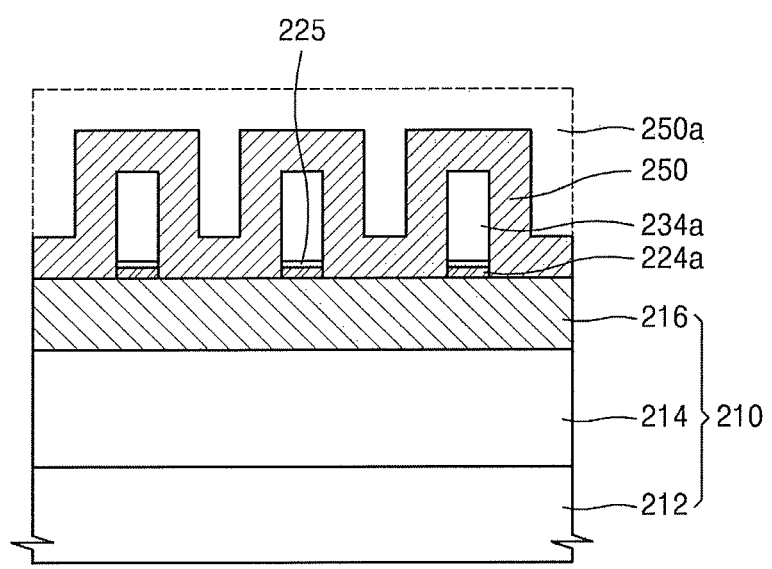

Referring to FIG. 7D, an SOX material may be formed on a sidewall of a line-and-space pattern 234a so as to form a spacer. As in FIG. 6C, a reaction area 250 may be formed by forming a layer 250a of an SOX precursor material and baking the layer 250a. Then, by removing an unreacted SOX precursor material, the reaction area 250 may be formed as illustrated in FIG. 7D.

Figure 7E:
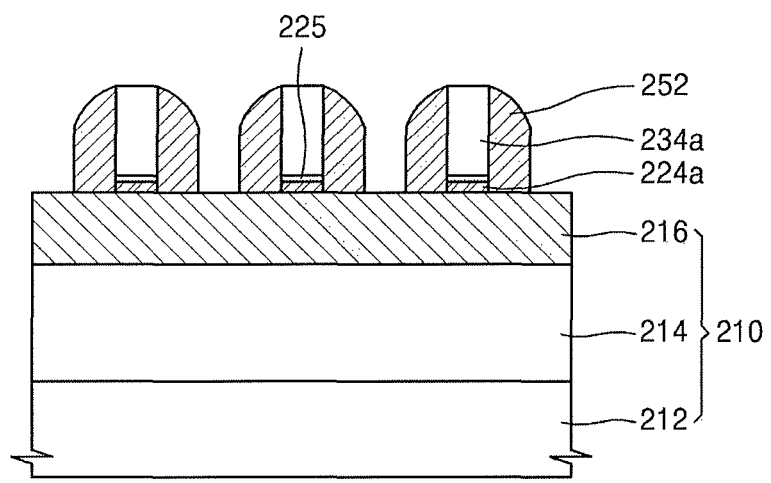

Referring to FIG. 7E, a spacer 252 may be formed by etching back the reaction area 250. Like in the previous embodiment, a width of the spacer 252 may be adjusted by controlling a baking time period.

Figure 7F:
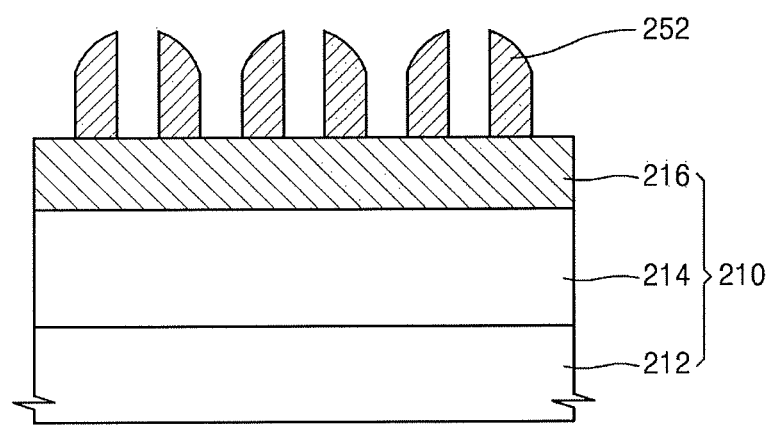
Figure 7G:
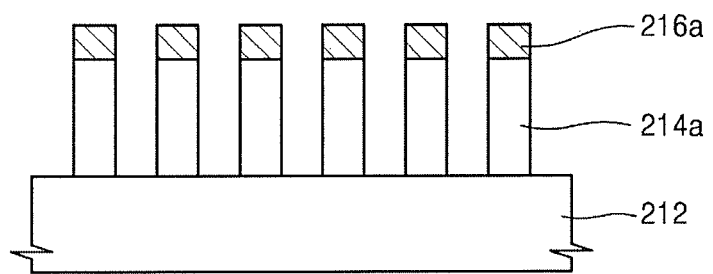

Referring to FIG. 7F, the line-and-space pattern 234a, and the covalent bond layer 225 and the developable anti-reflection film 224a disposed therebelow may be removed using a developing agent such as TMAH. As described above, the developable anti-reflection film 224a may be decross-linked by light received during the exposure, and may be removed at the same time with the line-and-space pattern 234a using the developing agent.

Referring to 7G, the polysilicon layer 216 may be etched by using the spacer 252 as an etching mask, and a polysilicon micropattern 216a to which a pattern of the spacer 252 may be transferred may be obtained. By etching the silicon oxide layer 214 by using the polysilicon micropattern 216a as an etching mask, a silicon oxide micropattern 214a to which the polysilicon micropattern 216a may be transferred may be obtained.

As can be seen from comparison between the exemplary embodiment of FIGS. 6A to 6H and the exemplary embodiment of FIGS. 7A to 7G, as the line-and-space pattern 234a and the anti-reflection film 224a may be removed together by using the developable anti-reflection film 224, the manufacturing of the semiconductor device may be simplified.

When the method of forming micropatterns according to the exemplary embodiment is used, a micropattern having a high aspect ratio may be manufactured without pattern collapse.

Figure 8:
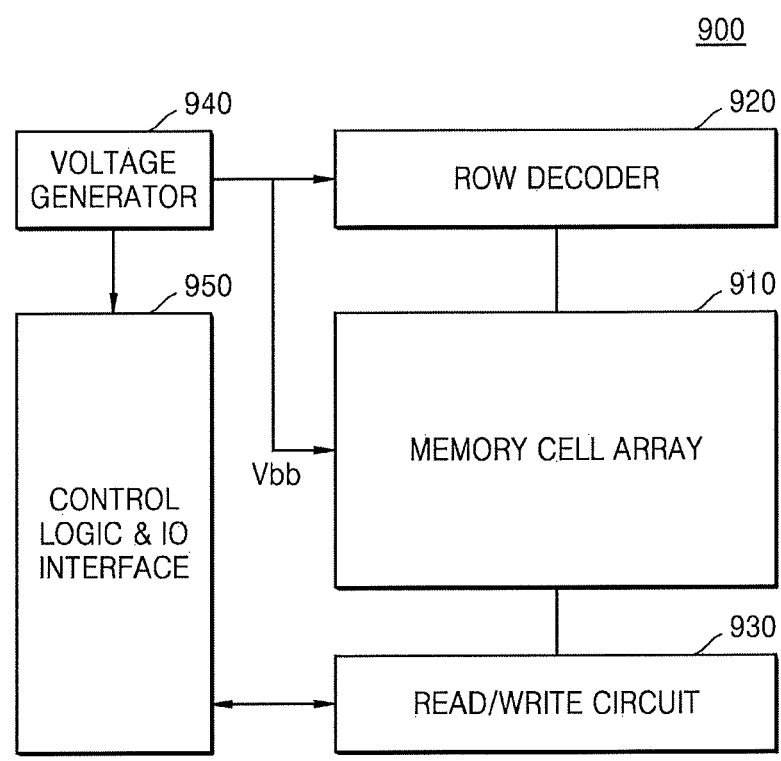
FIG. 8 illustrates a block diagram of an integrated circuit (IC) device according to an exemplary embodiment.

FIG. 8 illustrates a block diagram of a non-volatile memory device 900 according to an exemplary embodiment. The non-volatile memory device 900 including semiconductor devices according to exemplary embodiments will be described with reference to FIG. 8.

Referring to FIG. 8, the non-volatile memory device 900 may include, for example, a NAND flash memory device. In an embodiment, examples of the non-volatile memory device 900 may include a NOR flash memory, a resistive random access memory (RRAM), a phase-change RAM (PRAM), a magnetoresistive random access memory (MRAM), and a ferroelectric random access memory (FeRAM).

The non-volatile memory device 900 may have a three-dimensional array structure. The non-volatile memory device 900 according to the exemplary embodiment may be applied to a flash memory device including a conductive floating gate as a charge storage layer, and a charge trap flash (CTF) memory device including an insulating film as a charge storage layer.

The non-volatile memory device 900 may include a memory cell array 910, a row decoder circuit 920, a read/write circuit 930, a voltage generation circuit 940, and a control logic and input/output interface block 950.

The memory cell array 910 may include memory cells including word lines arranged in a row direction and bit lines arranged in a column direction. The memory cells may constitute memory blocks.

The row decoder circuit 920 may be controlled by the control logic and input/output interface block 950 and may select and drive the word lines of the memory cell array 910.

The read/write circuit 930 may be controlled by the control logic and input/output interface block 950 and may operate as a read circuit or a write circuit according to an operation mode. For example, the read/write circuit 930 may operate as a read circuit that reads data from the memory cell array 910 under the control of the control logic and input/output interface block 950. In a write operation (or a program operation), the read/write circuit 930 may operate as a read circuit that writes data to the memory cell array 910 under the control of the control logic and input/output interface block 950.

The voltage generation circuit 940 may be controlled by the control logic and input/output interface block 950 and may generate voltages for operating the non-volatile memory device 900. For example, the voltage generation circuit 940 may generate word line voltages to be supplied to the word lines of the memory cell array 910, such as a program voltage, a pass voltage, a verify voltage, and a select voltage, and a well bias voltage Vbb to be supplied to a substrate of the memory cell array 910 or a well formed in the substrate. The well bias voltage Vbb may be 0 V or a negative voltage according to the operation mode.

The control logic and input/output interface block 950 may control the overall operation of the non-volatile memory device 900. The control logic and input/output interface block 950 may provide a data transmission channel between the non-volatile memory device 900 and an external device, for example, a memory controller or a host. When a program operation is requested, the control logic and input/output interface block 950 may control the voltage generation circuit 940 such that the substrate on which memory cells may be formed or the well formed on the substrate may be biased to a negative voltage.

The control logic and input/output interface block 950 may include, for example, at least one integrated circuit device manufactured according to the exemplary embodiments.

Figure 9:
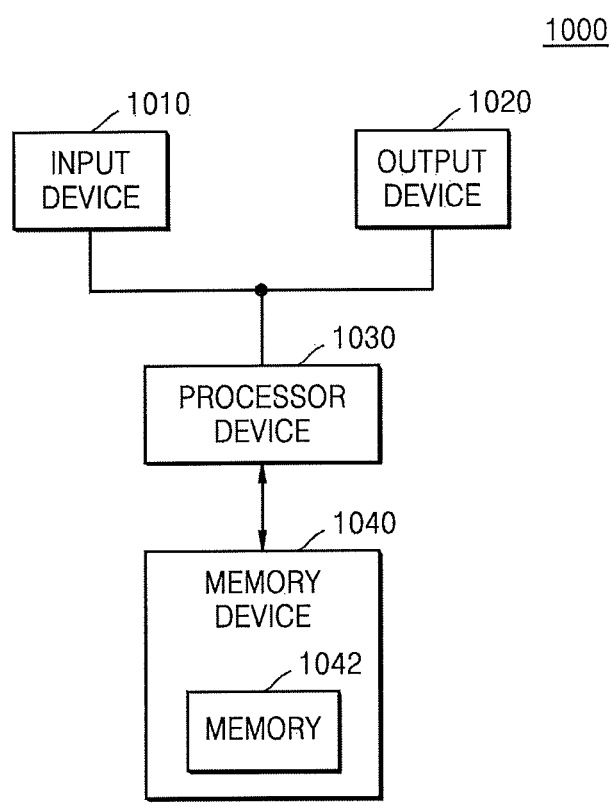
FIG. 9 illustrates a block diagram of an electronic system, including the IC device manufactured by the method of forming micropatterns, according to an exemplary embodiment of the incentive concept.

FIG. 9 illustrates a block diagram of an electronic system 1000, including the integrated circuit device manufactured by the method of forming micropatterns, according to an exemplary embodiment of the incentive concept.

Referring to FIG. 9, the electronic system 1000 may include an input device 1010, an output device 1020, a processor device 1030, and a memory device 1040.

The processor device 1030 may control the input device 1010, the output device 1020, and the memory device 1040 through each relevant interface. The processor device 1030 may include one or more selected from one or more microprocessors, one or more digital signal processors, one or more micro controllers, or one or more logic devices capable of performing the functions similar thereto.

One or more of the processor device 1030 or the memory device 1040 may include, for example, at least one of the integrated circuit devices manufactured according to the exemplary embodiments.

Each of the input device 1010 and the output device 1020 may include a key pad, a key board, or a display device.

The memory device 1040 may include a memory 1042, for example, a volatile memory device or a non-volatile memory device such as a flash memory device.

Figure 10:
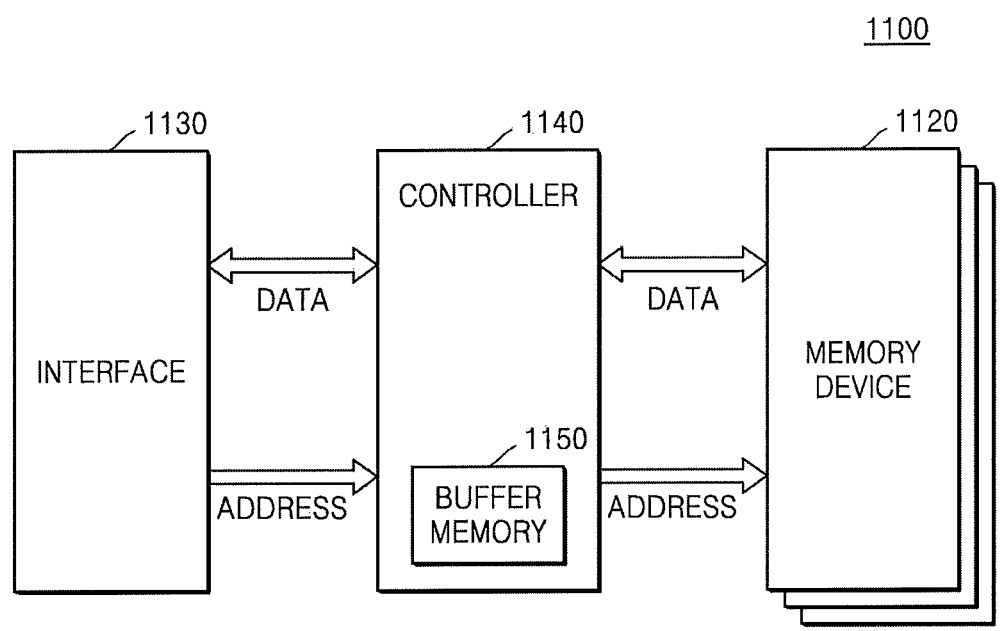

FIG. 10 illustrates a block diagram of a memory system 1100, including the integrated circuit device manufactured by the method of forming micropatterns, according to an exemplary embodiment of the incentive concept.

Referring to FIG. 10, the memory system 1100 may include an interface 1130, a controller 1140, and a memory device 1120.

The interface 1130 may provide interfacing between a memory system, for example, the electronic system 1000 and the hose illustrated in FIG. 9. The interface 1130 may be provided with a data exchange protocol to interface with the host. The interface 1130 may communicate with the host through one interface protocol selected from a universal serial bus (USB), a multi-media card (MMC), a peripheral component interconnect-express (PCI-E), a serial-attached SCSI (SAS), a serial advanced technology attachment (SATA), a parallel advanced technology attachment (PATA), a small computer system interface (SCSI), an enhanced small disk interface (ESDI), and an integrated drive electronics (IDE).

The controller 1140 may receive data and an address provided from the outside via the interface 1130. The controller 1140 may access the memory device, for example, the memory device 1040 of FIG. 9, with reference to the data and the address provided from the host. The controller 1140 may transfer the data read from the memory device 1120 to the host via the interface 1130.

The controller 1140 may include a buffer memory 1150. The buffer memory 1150 may temporarily store write data provided from the host, or the data read from the memory device 1120.

The memory device 1120 may be provided as a storage medium of the memory system 1100. For example, the memory device 1120 may include PRAM, MRAM, ReRAM, FRAM, NOR flash memory, or a combination thereof. The memory device 1120 may include, for example, at least one of the integrated circuit devices manufactured according the exemplary embodiments.

The memory system 1100 of FIG. 10 may be mounted on information processing devices, such as a personal digital assistant (PDA), a portable computer, a web tablet, a digital camera, a portable media player (PMP), a mobile phone, a wireless phone, and a laptop computer. The memory system 1100 may be, for example, an MMC card, a secure digital (SD) card, a micro SD card, a memory stick, an ID card, a personal computer memory card international association (PCMCIA), a chip card, a smart card, a USB card, a compact flash (CF) card.

By way of summation and review, with the advance in semiconductor devices, patterns may become finer and a semiconductor device manufacturing process may become complicated. For example, a line-and-space pattern or a pillar pattern having high resolution and a high aspect ratio may be necessary for manufacturing small semiconductor devices. However, a photoresist film having a high aspect ratio may be vulnerable to collapse, and there may be an obstacle to size reduction in semiconductor devices.

Embodiments relate to a method of forming micropatterns having a high aspect ratio, without pattern collapse.

According to embodiments, it may be possible to prevent a photoresist pattern from collapsing by forming a covalent bond between a bottom anti-reflection coating (BARC) and a photoresist film formed thereon.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming an etching target film on a substrate;
   forming an anti-reflection film on the etching target film;
   forming a photoresist film on the anti-reflection film;
   exposing the photoresist film;
   performing heat treatment on the anti-reflection film and the photoresist film to form a covalent bond between the anti-reflection film and the photoresist film; and
   developing the photoresist film,
   wherein the covalent bond is formed between a first material derived from the anti-reflection film and a second material derived from the photoresist film, and
   wherein the first material is a material having a hydroxy group (—OH) or an amine group (—NH$_2$), or a material capable of generating an amine group (—NH$_2$) by reacting with light.

2. The method as claimed in claim 1, wherein the material capable of generating the amine group is one or more of a cabamate, an aminoketone, an ammonium salt, an amide, an imine, an isocyanate, or an imide.

3. The method as claimed in claim 1, wherein the second material has a carboxy group (—COOH).

4. The method as claimed in claim 1, further comprising performing heat treatment on the anti-reflection film before forming the photoresist film.

5. The method as claimed in claim 1, wherein the photoresist film includes a polymer material that is deprotected by the exposing to form a carboxyl group.

6. The method as claimed in claim 5, wherein a light source for the exposing is a light source emitting an ArF excimer laser (193 nm), an F$_2$ excimer laser (157 nm), or extreme ultraviolet (EUV) (13.5 nm).

7. The method as claimed in claim 1, wherein the photoresist film is developed using a negative tone developer.

8. A method of forming micropatterns, the method comprising:
   forming an etching target film on a substrate;
   forming an anti-reflection film including a collapse preventing agent on the etching target film;
   forming a photoresist film on the anti-reflection film;
   exposing the photoresist film;
   performing heat treatment on the anti-reflection film and the photoresist film to form a covalent bond between the anti-reflection film and the photoresist film; and
   developing the photoresist film,
   wherein the covalent bond is formed between the collapse preventing agent of the anti-reflection film and a second material derived from the photoresist film, and
   wherein the collapse preventing agent is a material having a hydroxy group (—OH) or an amine group (—NH$_2$), or a material capable of generating an amine group (—NH$_2$) by reacting with light.

9. The method as claimed in claim 8, wherein the material capable of generating the amine group is one or more of a cabamate, an aminoketone, an ammonium salt, an amide, an imine, an isocyanate, or an imide.

10. The method as claimed in claim 8, wherein the photoresist film includes a photosensitive component having an ester group (—COO—).

11. The method as claimed in claim 10, wherein the photosensitive component is a material capable of forming the covalent bond with the collapse preventing agent through the heat treatment.

12. The method as claimed in claim 10, wherein the photosensitive component is a material that is deprotected by the exposing to form a carboxy group.

13. A method of manufacturing a semiconductor device, the method comprising:
   forming an etching target film on a substrate;
   forming an anti-reflection film on the etching target film;
   forming a photoresist film on the anti-reflection film;
   exposing the photoresist film corresponding to a pattern;
   performing heat treatment on the anti-reflection film and the photoresist film to form a covalent bond between the anti-reflection film and the photoresist film;
   removing a non-exposure portion of the photoresist film to form the pattern;
   forming a spacer having an etch selectivity on a sidewall of the pattern;
   removing the pattern; and
   patterning the etching target film by using the spacer as an etching mask,
   wherein the covalent bond is formed between a collapse preventing agent of the anti-reflection film and a second material derived from the photoresist film, and
   wherein the collapse preventing agent is a material having a hydroxy group (—OH) or an amine group (—NH$_2$), or a material capable of generating an amine group (—NH$_2$) by reacting with light.

14. The method as claimed in claim 13, wherein the covalent bond is formed in the form of an ester group (—COO—) or an amide group (—CONH).

15. The method as claimed in claim 13, wherein the heat treatment is performed on the anti-reflection film and the photoresist film at a temperature of about 85° C. to about 150° C. for about 30 seconds to about 30 minutes.

16. The method as claimed in claim 13, wherein:
   the pattern collapse preventing agent is a $C_{10}$-$C_{1000}$ hydrocarbon compound.

* * * * *